United States Patent [19]

Danish

[11] Patent Number: 4,616,213
[45] Date of Patent: Oct. 7, 1986

[54] CAPACITIVE MULTIKEY KEYBOARD FOR INPUTTING DATA INTO A COMPUTER

[75] Inventor: Sherif Danish, Tulsa, Okla.

[73] Assignee: Polytel Corporation, Tulsa, Okla.

[21] Appl. No.: 458,142

[22] Filed: Jan. 14, 1983

[51] Int. Cl.⁴ .............................................. G06F 3/02
[52] U.S. Cl. .......................... 340/365 C; 340/365 S; 178/17 C
[58] Field of Search ............ 340/365 R, 365 S, 365 C; 178/18, 17 C; 400/494, 483, 87, 122; 200/DIG. 1

[56] References Cited

U.S. PATENT DOCUMENTS

| | | | |
|---|---|---|---|
| 4,078,257 | 3/1978 | Bagley | 340/365 VL |
| 4,305,065 | 12/1981 | Mogi | 340/365 S |
| 4,415,781 | 11/1983 | Frame | 340/365 C |
| 4,429,301 | 1/1984 | Crumley | 340/365 S |
| 4,495,485 | 1/1985 | Smith | 340/365 C |
| 4,555,693 | 11/1985 | Danish | 340/365 R |

OTHER PUBLICATIONS

*IBM Technical Disclosure Bulletin*, Holt, vol. 14, No. 8, Jan. 1972, p. 2277.

Primary Examiner—John W. Caldwell, Sr.
Assistant Examiner—Michael F. Heim
Attorney, Agent, or Firm—Head, Johnson & Stevenson

[57] ABSTRACT

A multikey keyboard for inputting data into a computer, wherein pressing a key places in circuit the point of intersection of a row conductor and column conductor respectively connected to portions of separate row and column sequential series of capacitors whose cumulative capacitance correspond to the specific row and columns of the pressed key, thus allowing the computer to establish which key was pressed by measuring the capacitance between the events involving said completed keyboard circuits.

18 Claims, 9 Drawing Figures

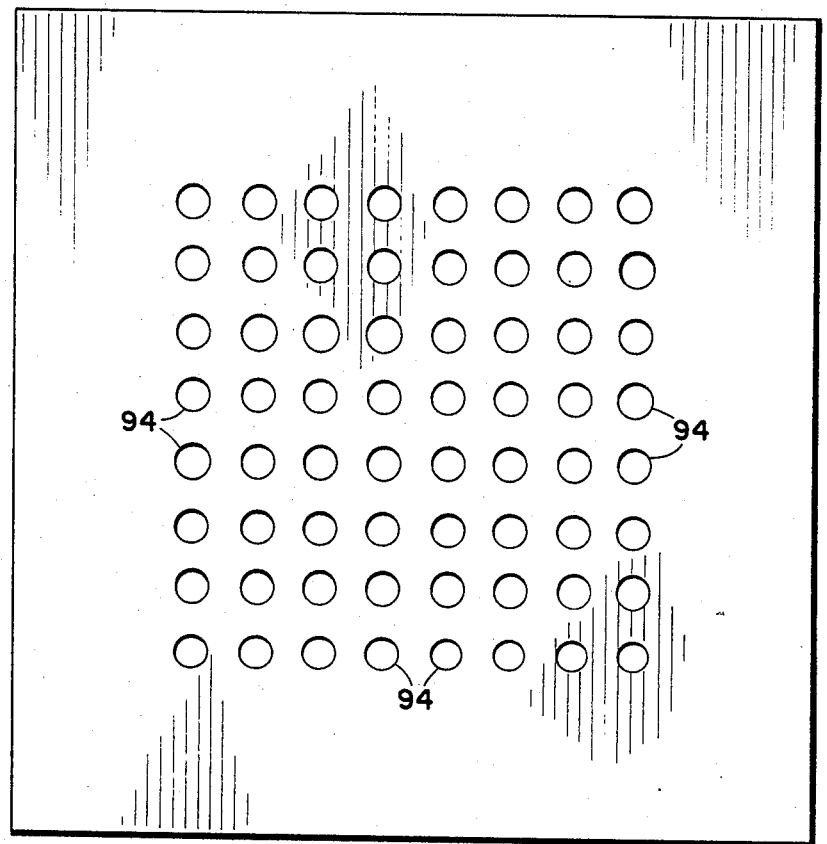
Fig.6
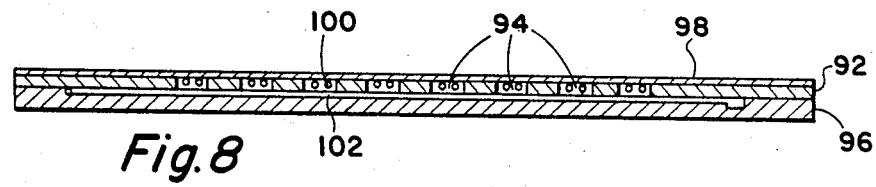
Fig.8
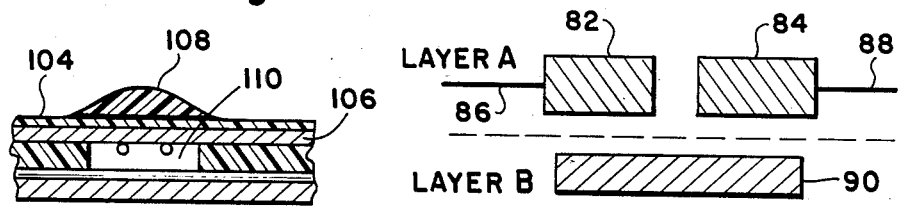
Fig.9
Fig.7

CAPACITIVE MULTIKEY KEYBOARD FOR INPUTTING DATA INTO A COMPUTER

BACKGROUND OF THE INVENTION

1. Field of the Invention

This invention relates to a capacitive multikey keyboard for inputting data into a computer. More specifically, the invention relates to an array or matrix keyboard potentially involving a large number of individual keys wherein the specific row and column of the key being pressed is identified by the computer by virtue of measuring the capacitance of a row and column determining keyboard output circuits.

2. Description of the Prior Art

Multikey keyboards for inputting data into a computer generally involve a plurality of normally open switches wherein the pressing of each key of the keyboard closes a corresponding switch. The set of normally open switches can be viewed as defining a switch matrix or switch array which in the conventional prior art keyboards have a plurality of input lines and a plurality of output lines. Pressing a key on the keyboard thus closing the corresponding switch creates electrical continuity and completes the circuit between the specific input and output lines corresponding to the respective position or identity of the key being pressed. This plurality of keyboard leads, in the conventional keyboard, is connected to at least one encoder which translates or converts the signals from the multiple key input circuits into a single alphanumeric coded output signal; e.g. into ASCII or binary coded decimal (BCD) format or the equivalent. The output signal from the keyboard encoder can then either be directed to the computer as the keyboard input or can be further processed by additional dedicated keyboard circuitry, depending on the particular manufacturing and overall computer system requirements, before entering the computer. Thus, it is not uncommon to find that the keyboard in addition to having an encoder will have its own dedicated memory and logic circuit essentially duplicating, in principle, that which the central processing unit (CPU) is theoretically capable of doing and consequently, increasing the cost of the keyboard. In practice, the presence of multiple input and output lines from the keyboard to the encoder tends to limit the number of keys present on the keyboard. Thus, in principle, the need for a relatively inexpensive, yet reliable, keyboard having the ability to contain a vast number or array of keys, yet having only a few output lines that bypass the encoder and optional auxiliary circuitry to serve as direct analog input to the computer still exists and represents a desirable theoretical objective.

SUMMARY OF THE INVENTION

In view of the prior art, I have discovered an improved multikey computer input keyboard capable of having a very large matrix or array of keys which bypasses the need for a keyboard encoder and the need for a plurality of input and output leads corresponding to the switch matrix or array. According to the present invention, the number of keyboard output lines or circuits serving as the computer input can be reduced, in principle, to a single computer input line. In one preferred embodiment, the number of keyboard output lines serving as the computer input is reduced to two separate lines wherein one corresponds to the row and the other corresponds to the column of the key being pressed or an equivalent two dimensional representation of the position of the pressed key. Further, according to all embodiments of the present invention, the identity of the specific row and column (i.e., determination of the position of the key being pressed) is established by virtue of measuring the capacitance associated with the row circuit and/or the column circuit wherein each row and each column are distinguished by cumulative capacitance values of individual capacitors present between each successive row and/or column circuit. In other words, each successive sequential row and/or column adds another capacitor to the respective overall or total output circuit in a series or cascaded relationship.

In another preferred embodiment of the present invention, the number of keys present on the multikey keyboard is exponentially increased by the multiplicity of the keyboard switch. In this specific embodiment, the pressing of a key closes a multiple pole switch completing a plurality of output circuits also corresponding to the multiplicity of the switch. And still in another preferred embodiment of the present invention, the individual sequential capacitors added in series to the respective row and/or column output circuit are nonlinearly incrementally increased such as to enhance the resolution of cumulative capacitance measurements and aid in discriminating which key was pressed.

It is further provided that the multikey keyboard, switch matrix and capacitor be printed circuits involving two opposed printed circuit sheets separated by an insulating sheet perforated at the position of the keys wherein at least one printed sheet is sufficiently flexible such that pressing at the position of the key completes the output circuit by physically contacting the printed circuit sheets to each other. It is also envisioned that, particularly in the case of vast arrays of keys, an information panel or overlay be provided to effect the selection of keys and corresponding desired data input. Such an overlay could also be in Braille or have deformed key tabs to assist in striking the key.

Thus, the present invention provides a multikey keyboard for inputting data into a computer, comprising:

(a) at least one sequential series of a plurality of capacitors representing the keyboard output to the computer;

(b) a plurality of normally open, key activated, switch means wherein one of the plurality of switch means is operatively connected between each of the capacitors; and (c) a common circuit lead operatively connected to each of the plurality of switch means such that when a key is pressed the corresponding normally open switch means closes, thus competing the circuit between the common circuit lead and that portion of the sequential series of the plurality of capacitors cumulatively corresponding to the capacitance associated with the pressed key, thus allowing the computer to establish which key was pressed by measuring the capacitance of the completed keyboard circuit.

It is an object of the present invention to provide a multikey computer keyboard that allows the computer to distinguish which key is being pressed by virtue of measuring the capacitance associated with an electrical circuit completed by pressing the key. It is another object that this multikey keyboard be inexpensive and reliable and compatible with having a large number of keys, yet involving only a few analog inputs to the computer, thus bypassing the need for a keyboard encoder or memory. Fulfillment of these objects and the presence and fulfillment of additional objects will be apparent upon complete reading of the specification and claims taken in conjunction with the attached drawing.

BRIEF DESCRIPTION OF THE DRAWINGS

FIG. 6 illustrates the insulated keyboard spacer to be placed between the printed circuits of FIGS. 4 and 5.

FIG. 7 illustrates a typical printed capacitor useful in the present invention.

FIG. 8 is a cross-sectional view of a portion of the keyboard involving the printed circuits of FIGS. 4 and 5 and insulated keyboard spacer of FIG. 6.

FIG. 9 is an enlarged cross-sectional view of a portion of the keyboard involving the printed circuit type key with informational overlay and raised key tabs.

DESCRIPTION OF THE PREFERRED EMBODIMENTS

Figure 1:
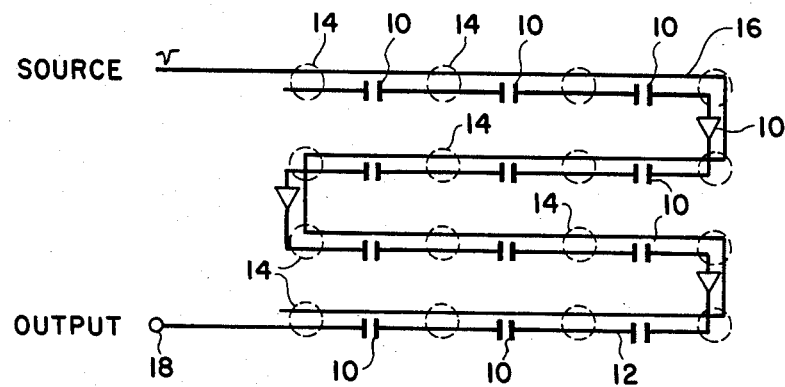
FIG. 1 is a schematic drawing illustrating a simplified capacitive keyboard according to the present invention.

The capacitive multikey keyboard, according to the present invention, how it functions and how it differs from the prior art keyboards can perhaps be best explained and understood by reference to the drawing. FIG. 1 is a simplified schematic illustration of the basic concept of providing and using a sequence of capacitors 10 conductively interconnected in series by output conductor 12 to establish which key switch 14 has been pressed. Parallel to the sequential series of capacitors 10 is a voltage source conductor 16. The keyboard keys, or more specifically, the key switches (represented by dashed circles) are located between each capacitor 10 and are positioned such that when the key is pressed, electrical continuity is established between the source conductor 16 and the capacity output conductor 12, thus bringing into the keyboard output circuit that portion of the capacitive series that is located between the pressed key of the keyboard and the keyboard output terminal 18.

The value of the capacitance associated with the respective portion of the sequence of capacitors brought into the keyboard output circuit will be unique for each key being pressed; therefore, measuring the capacitance while the key is being pressed will establish which key is pressed. Since the striking or pressing of a key is a physical manipulation involving a time span of at least fifty milliseconds in duration, there will be ample time to make repeated measurements of the closed circuit. The actual capacitance measurement can be accomplished by any of the techniques well known in the art. Usually some form of circuit monitoring or signal sensing to detect the closing of a key (as exemplified later) will be required.

Figure 2:
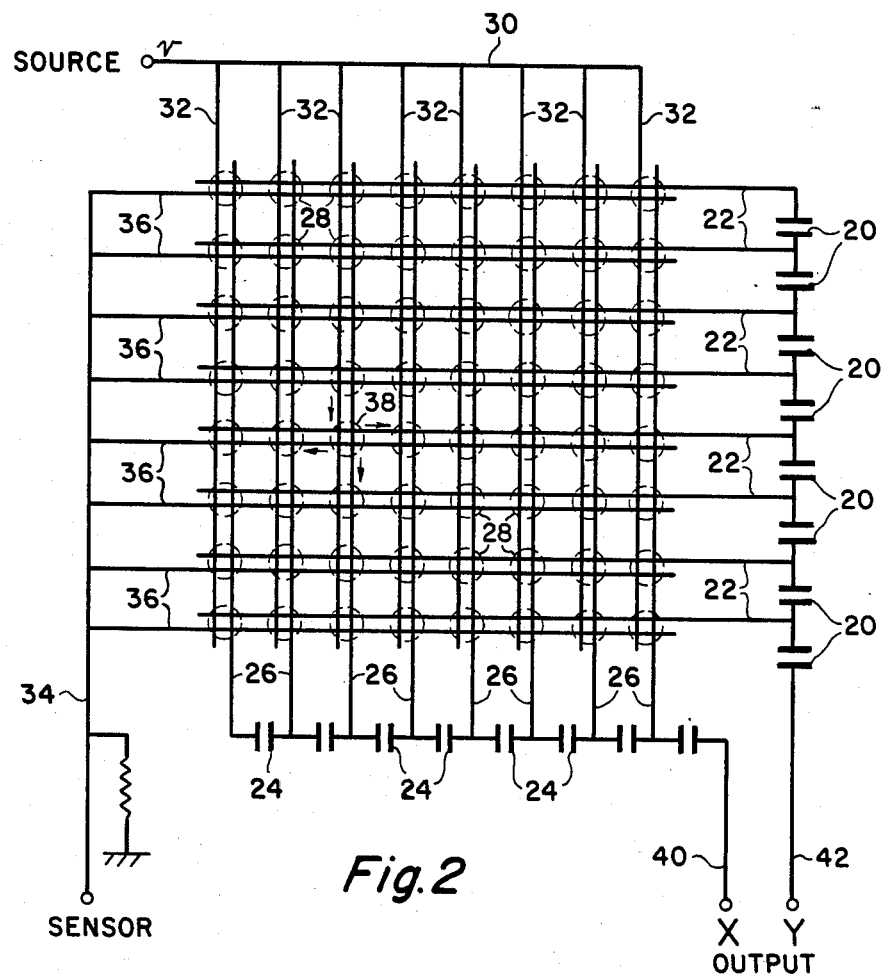
FIG. 2 is a schematic illustration of a capacitive matrix keyboard according to the present invention.

FIG. 2 illustrates a particularly useful preferred embodiment of the present invention wherein two separate sequential series of capacitors are provided to create a matrix keyboard. One series of capacitors 20 identifies the row of the key (i.e., the Y argument or coordinate; the Y rank of the matrix). In between each row capacitor 20 is a horizontal row conductor 22, one conductor for each row of keys on the keyboard. Similarly, the second series of capacitors 24 identifies the column of the keys (i,e., the X argument or coordinate; the X rank of the matrix). In between each successive column capacitor 24 is a vertical column conductor 26, one conductor for each column of keys on the keyboard. At the intersection or crossover point of each of the row and column conductors (22 and 26) is a key switch 28 illustrated in FIG. 2 as a dashed circle. There is one key switch 28 for each intersection of the row and column conductors, thus forming a two dimensional array or matrix of keys.

As further illustrated in FIG. 2, a voltage source line or common circuit lead 30 with a plurality of parallel conductors 32 is provided. As shown, the parallel conductors 32 are vertically positioned such that there is one conductor 32 for each column of keys wherein the conductor 32 passes directly below each key of the column of keys and represents the third pole of each key switch 28. Similarly, a separate sensor line 34 with a plurality of parallel conductors 36 is provided. The conductors 36 are arranged in a horizontal configuration wherein one conductor 36 passes directly below each key of each respective row of keys and thus represents the fourth pole of each key switch 28. The source line 30, as illustrated in FIG. 2, is also resistively connected to both the X an Y rank determining output leads beyond the capacitors and near the output terminals 40 and 42 via line 37 and resistors 39 and 41. In this manner, the overall keyboard and specifically the capacitive circuits are compatible with some contemporary home computers already having a capacitive value across the analog I/O terminal of the computer.

In order to operate the keyboard of FIG. 2, a key of the keyboard is pressed, such that the corresponding key switch brings into electrical contact all four conductors intersecting at the location of the pressed key. For example, if key 38 of FIG. 2 is pressed, the electrical circuits between the common circuit lead 30 (via conductor 32) and the sensor conductors 34, the X output conductor 40 and the Y output conductor 42 are simultaneously completed as indicated by the arrows near key 38 of FIG. 2. Since the common circuit lead 30 is a voltage source, the sensor output conductor 34 will experience an instantaneous voltage rise of v volts which corresponds to pressing the key 38.

By connecting the four keyboard electrical leads to the appropriate voltage source and logic I/O terminals of the computer (e.g., the source to a 5 volt D.C. lead or an annunciator computer output held at +5 volts; the X and Y keyboard outputs to analog I/O terminals of the computer and the sensor to a switch I/O terminal of the computer) the computer can monitor the sensor line to establish when a key is pressed. Upon observing the appropriate voltage rise on the sensor output lead, the computer is alerted to the pressing of a key on the keyboard. The computer then proceeds to measure the capacitance of the X and Y keyboard output circuits and uniquely identify the corresponding row and column of the particular key pressed. At this point, the appropriate data corresponding to the key pressed is created by software already preprogrammed in the CPU of the computer, thus bypassing the need for a hard wired encoder. Since the pressing of the key on the keyboard is a physical manipulation occurring on a time scale much greater than needed to identify the pressed key, considerable latitude and freedom is available to confirm the signal as being from a pressed key as opposed to an extraneous or erroneous signal or key operation. Thus, in principle, multiple measurements can be made to confirm that the key was intentionally struck and to optimize the reliability of the computer discrimination as to which key is being pressed. Thus, the present invention has the added advantage of being highly reliable and self-diagnostic at a very fundamental, normally suspect data input step.

The physical configuration of the keys and key switches, rows and columns, and respective X, Y, source and sensor conductors of FIG. 2 is somewhat arbitrary. In particular, the relative position of the source and sensor lines can be readily interchanged. In fact, the rows and columns of the matrix of keys do not have to be of equal rank (square) nor do they have to be straight lines nor in a horizontal and vertical relationship to each other. In comparing the embodiment of FIG. 1 with that of FIG. 2, it should be readily apparent that FIG. 1 is essentially a two dimensional matrix keyboard wherein one independent coordinate has a rank of 1 (a column or row matrix). In view of this, the respective rows and columns of the matrix keyboard of FIG. 2 can also loop back making successive passes across the face of the keyboard, yet still be an equivalent structure for purposes of this invention. However, the embodiment of FIG. 2 is particularly useful in that it is readily manufactured and conceptually easy to perceive and understand.

Figure 3:
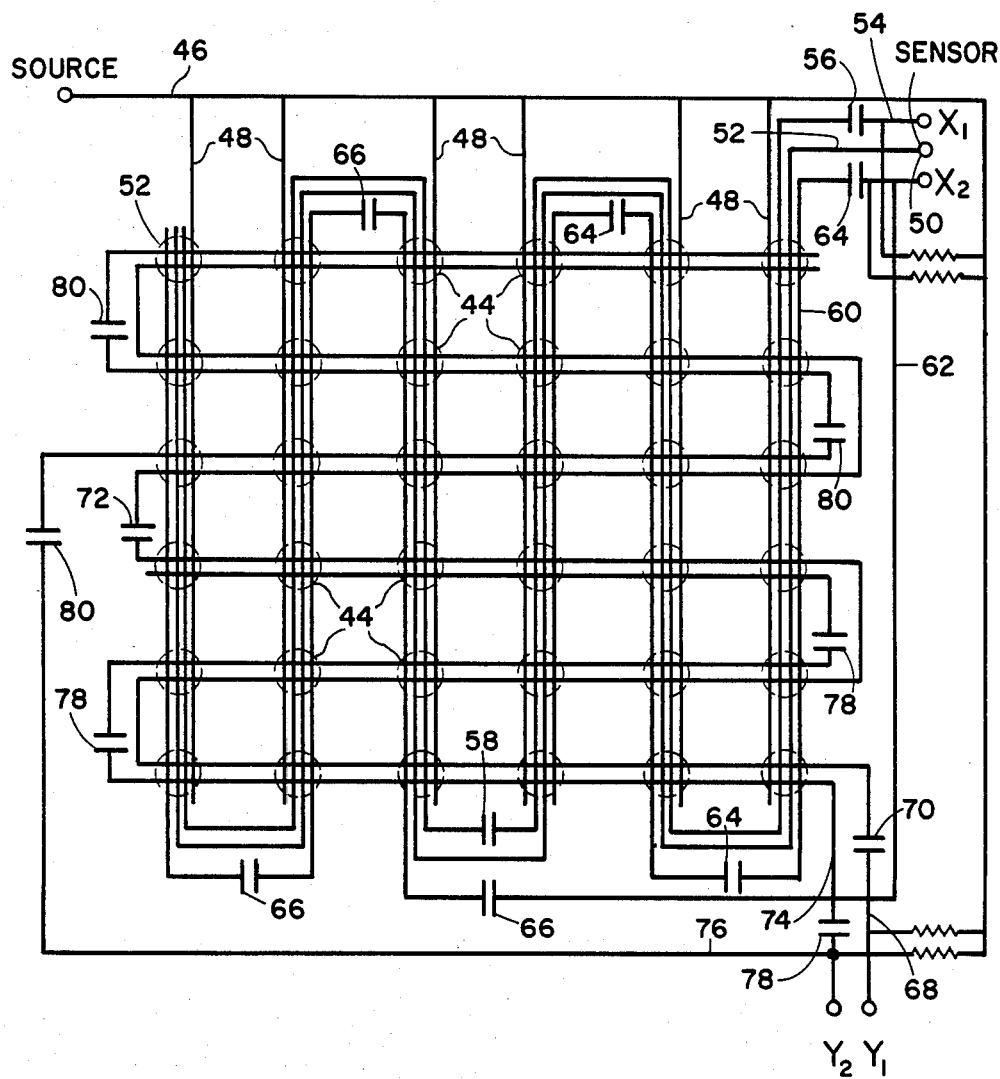
FIG. 3 illustrates an alternate embodiment of the matrix capacitive keyboard according to the present invention.

FIG. 3 of the drawing illustrates another preferred embodiment which involves a matrix keyboard having a plurality of interrelated yet separate row and column input leads. By using more than one row input lead and one column input lead, the number of keys in the matrix keyboard can be exponentially increased for a given series of capacitors. In other words, if the particular computer employed was limited in that it could resolve only up to 10 capacitors in series, the upper limit to the matrix or array would be 100 keys (a 10 by 10 matrix of keys). However, according to the embodiment of FIG. 3, the use of four output leads (two X outputs and two Y outputs) with the same resolution would lead to a 100 by 100 matrix of keys, or 10,000 individual keys as the upper limit.

FIG. 3 illustrates a thirty-six key matrix keyboard (a 6 by 6) wherein only three discreet capacitors are connected in series in any given conductive output circuit. More specifically, the thirty-six keys or key switches 44 (again represented as dashed circles) individually encompass or make electrical contact between six intersecting connectors. A single voltage source circuit is provided involving conductive lead 46 and a plurality of common conductor leads 48 in a manner analogous to the previous embodiment of FIG. 2. The embodiment of FIG. 3 also has a single sensor output terminal 50 involving a continuous sensor conductor 52 that winds in a serpentine fashion from one column of keys to the next, maintaining a path that is essentially parallel to the source circuit conductors 48 as it passes through the respective thirty-six key switches 44. Essentially parallel to this sensor conductor 52 is the first of four keyboard cascaded capacitive circuits 54. Circuit 54 is also the first of two separate but related column determining output circuits designated on FIG. 3 as output terminal $X_1$. Circuit 54 also contains two separate capacitors 56 and 58 which conceptually divide the columns of the matrix keyboard into a left half and a right half. In other words, when a key on the left side of the keyboard is pressed, the capacitance observed at the $X_1$ keyboard output terminal will be characteristic of the sum of the capacitance associated with the elements 56 and 58. In contrast, keys on the right half of the keyboard will have an $X_1$ capacitance characteristic of element 56 only. Thus, output terminal $X_1$ establishes whether the key pressed is in the first three columns or the fourth through sixth columns of the keyboard.

The second column output circuit designated in FIG. 3 as terminal $X_2$ involves a pair of parallel electrical circuits or conductors 60 and 62 which divide the left and the right halves of the keyboard into separate sets of three capacitors (set 64 and set 66) with each capacitor respectively positioned such as to establish whether the pressed key is in the first, second or third relative column at the left or the right side of the keyboard. In other words, the capacitance measured at column output terminal $X_2$ will either be the sum of one, two or three capacitors which cumulative value serves to uniquely specify the relative position of the column within the set of three columns involved. By combining the information associated with the $X_1$ column output terminal with that of the $X_2$ column output terminal, the specific X rank or column of the pressed key is uniquely established.

In an analogous manner, FIG. 3 provides for two separate row output terminals designated as $Y_1$ and $Y_2$. The $Y_1$ circuit involves one conductor 68 and to capacitors 70 and 72, inseries, to establish an upper half and lower half of the keyboard matrix. Row output terminal $Y_2$ has two electrically parallel conductor circuits 74 and 76 with the individual sets of three capacitors in series (set 78 and 80) which establish the relative row of the pressed key within the set. In other words, the capacitance associated with the keyboard output $Y_1$ establishes whether the pressed key is in the upper or lower half of the matrix and the capacitance associated with the keyboard output $Y_2$ establishes the relative position of the row of the pressed key within the upper or lower half.

The embodiment of FIG. 3 is particularly useful when either the computer to be employed is compatible with multiple analog keyboard inputs and the number of keys available in the matrix keyboard is to be maximized, or in situations wherein the ability of the computer to resolve successive capacitance measurement is the limiting factor as to how many keys can be used on the keyboard. In theory, the feature disclosed in FIG. 3 can be employed to use a very large array of individual keys with a very small number of specific capacitor sizes. In all of the embodiments of the present invention and particularly in the embodiment of FIG. 3, if computer resolution is critical, nonlinear incremental increases in the capacitance value can be employed advantageously. For example, in the embodiment illustrated in FIG. 3, a selection of five consecutive capacitors, wherein each successive capacitance doubles the cumulative capacitance of the circuit thus leading to high confidence in resolving which key was pressed, also provides a matrix keyboard of up to 625 keys, yet only four separate keyboard analog outputs are necessary. Since many of the microcomputers already on the market are compatible with multiple analog keyboard inputs, the concept of the present invention should be readily compatible with the already existing market by supplying a multikey keyboard that merely plugs into existing units. For those computers with fewer than four analog keyboard inputs, the concept of providing a computer controlled relay switching circuit to interface to a multioutput keyboard to a computer of few analog input lines is quite feasible and compatible with the present invention.

Figure 5:
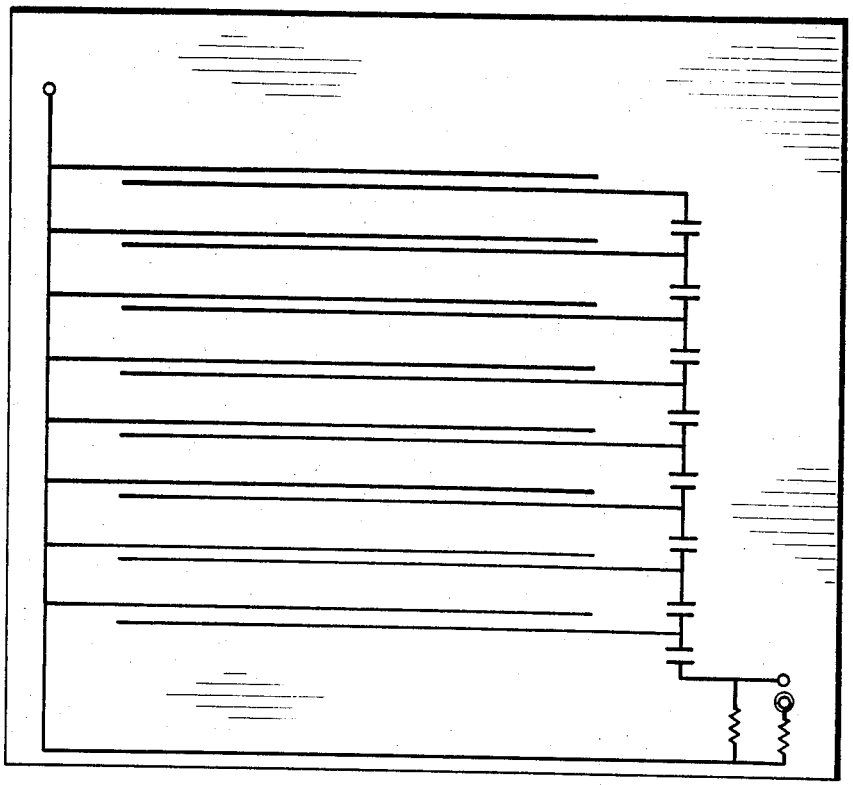
FIGS. 4 and 5 schematically illustrate the printed circuit forming a keyboard according to the embodiment of FIG. 1.
Figure 4:
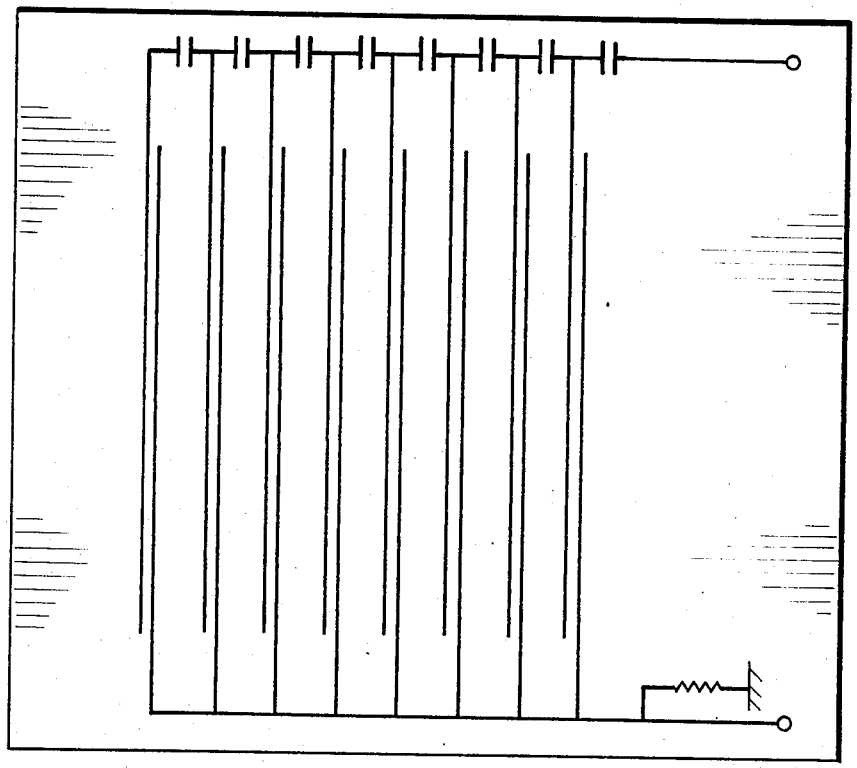

The preferred method of constructing a multikey keyboard according to the present invention is illustrated in FIGS. 4 through 8 wherein the components of a flexible printed circuit keyboard are shown. FIGS. 4 and 5 illustrate symbolically the conductive faces of two layers of printed circuits corresponding to the embodiment of FIG. 2. As illustrated, FIG. 5 is intended to be flipped over and thus directly face the top view of FIG. 4 during assembly of the keyboard (i.e., FIG. 5 is a mirror image of a portion of FIG. 2). Preferably, the capacitors are printed circuits integrally assembled on a printed board at the time of making the parallel conductor circuits. FIG. 7 illustrates a printed capacitor particularly useful in the present invention where conductive ink is used to print a pair of separate flat geometric surfaces 82 and 84 each connected to printed conductors 86 and 88 on one layer or sheet. On a second layer or sheet is a single flat geometric surface 90 of conductive ink coextensive geometrically with the sum of surfaces 86 and 88 and intended to be superimposed directly over surfaces 86 and 88 (as implied by the dashed fold line) but not in direct electrical contact. However, the concept of soldering individual capacitors onto the printed board should be considered equivalent for purposes of this invention. In assembling the keyboard, at least one of the printed conductive circuit boards of either FIGS. 4 or 5 should be sufficiently flexible such that they can be sandwiched together with an intermediate perforated insulated layer 92 as shown in FIGS. 6 and 8. In this manner, the holes 94 in the perforated insulated middle layer keep the printed circuit boards 96 and 98 from making direct contact, but when one presses on the flexible surface 98 at a hole, the upper conductive layer 100 can flex and make electrical contact with the lower printed circuit 102. In this manner, and as shown in the cross-sectional view of FIG. 8, the holes in the board actually serve as the key switches. Such flexible keyboards can be made of any of the conventional materials and by any of the conventional techniques as well known in the art. In particular, conductive ink printed or deposited on flexible mylar is envisioned as one preferred keyboard assembly technique. The concept of printing the intermediate insulating layer by the use of insulating ink, as again known in the art, is also envisioned as being particularly useful to produce a relatively inexpensive keyboard. The keyboard of the present invention is also viewed as being compatible with various instructional overlays, including pictorial maps, symbolic data input notations or the like. As illustrated in the enlarged cross-sectional view of FIG. 9, the instructional overlay 104 can be placed directly over the upper flexible printed sheet 106. As further illustrated, the use of the informational overlay 104 is also conducive to the use of raised or deformed flexible key tabs 108 which assist in correctly positioning the finger over the key opening 110. The use of Braille on the overlay or deformed key tab is also compatible with the present invention. In principle, the keyboard can be produced very inexpensively in a relatively thick sheet like structure. As such, the concept of providing a loose leaf package or even a book or catalog wherein a page or pages are in fact keyboards is well within the contemplated scope and utility of the present invention. Since the keyboards of the present invention are viewed as alternate or complementary keyboards to many home computers, the concept of having a throwaway keyboard or a keyboard of value for a limited duration is also compatible with the present invention. These features in combination with the ability to virtually have an unlimited number of keys leads to a very flexible and convenient method of inputting data to a computer. This in turn should result in extremely simple and so-called "friendly" interaction between the user-/operator and the computer.

In view of the above description of the preferred embodiments of the present invention, it should be apparent that the advantages associated with the invention are numerous. First, the keyboard is of simple construction. It eliminates the need for an encoder or dedicated keyboard memory. It eliminates numerous electrical connections. It utilizes direct analog input to the computer. And, it is amenable to a very large number of keys with minimum computer input leads.

The software associated with the present invention is virtually unlimited, once the identity of the key being pressed is established. Thus, the keys can function in a conventional manner duplicating identically the conventional keyboard patterns, key functions and key arrangements or arbitrarily any known keyboard, typewriter, court recording device or the like by merely selecting the proper software. In addition, the presence of more keys allows for essentially an unlimited number of function keys (one of the shortcomings of previously known keyboards). The keys themselves can also be programmed by the use or pre-programmed to function as switches either for controlling keyboard assignment or for controlling external computer monitored devices and hardware. In many respects, the keyboard of the present invention, because of the vast plurality of keys, will allow contemporary computer software to be less menu oriented, even to the extent that the CRT menu display will be permanently supplemented and simplified by the use of informational overlays attached to the matrix keyboard (a degree of friendliness heretofore pragmatically unobtainable).

To further illustrate the present invention, the following example is presented demonstrating some of the fundamental features of the matrix keyboard according to the present invention.

EXAMPLE

A membrane type nine key (3 by 3) keyboard having a wiring configuration equivalent to FIG. 2 and using two sets of three sequential serial, equal value, capacitors is prepared compatible with connecting to the Apple II computer.

The horizontal pairs of sensor and Y output conductors are printed on the upper side of the bottom layer of mylar film. The upper conductor of each pair of horizontal conductors is connected to separate points in the serial cascade of three printed capacitors on the mylar. The last capacitor is connected to the Y output of the keyboard which goes to pin PDL(0) of the game I/O socket of the Apple II. The lower conductor of each horizontal pair is connected to the sensor line output of the keyboard which goes to pin PB0 of the game I/O socket.

The vertical pairs of source and X output conductors are printed on the underside of the top layer of mylar film. The right connector of each pair of vertical conductors is connected to separate points in the serial cascade of three printed capacitors on the mylar. The last capacitor ends at the X output of the keyboard and goes to pin PDL(1) of the game I/O socket. The left connector of each vertical pair is connected to a common source lead that attaches to the positive 5 volt source pin of the Apple II game I/O socket.

When a key is pressed, the positive 5 volt source becomes connected to the sensor line and the computer immediately recognizes that a key is pressed. The Apple II computer proceeds to measure the capacitance of the X and Y keyboard output circuit using built in software intended for capacitance measurements. From the measured capacitance values, the computer calculates the coordinates of the key which was pressed and proceeds to execute the command or function associated with said key.

Having thus described the invention with a certain degree of particularity, it is manifest that many changes can be made in the details of construction and arrangement of components without departing from the spirit and scope of this disclosure. Therefore, it is to be understood that the invention is not limited to the embodiments set forth herein for purposes of exemplification, but is to be limited only by the scope of the attached claims, including a full range of equivalents to which each element thereof is entitled.

I claim:

1. A multikey keyboard for inputting data into a computer comprising:
   (a) a first and second separate sequential series of a plurality of capacitors wherein one end of each of said sequential series, respectively, represents the row and column keyboard output to said computer;
   (b) a first plurality of essentially parallel conductors representing rows of keys on said keyboard wherein one of said plurality of conductors is connected between each of said capacitors of one of said separate sequential series;
   (c) a second plurality of essentially parallel conductors superimposed and essentially perpendicular to said first parallel conductors, thus representing columns of keys, wherein one of said second plurality of conductors is connected between each of said capacitors of said other separate sequential series;
   (d) a plurality of normally open, key activated, switch means located at the intersection of the row and column conductors forming a matrix keyboard; and
   (e) a common circuit lead operatively connected to each of said plurality of switch means such that when a key is pressed, the corresponding normally open switch means closes thus completing the circuit between said common circuit lead and that portion of both of said sequential series of said plurality of capacitors cumulatively corresponding to the capacitance associated with the row and column of said pressed key, thus allowing the computer to establish which key was pressed by measuring the capacitance of said completed keyboard circuits between said common circuit lead and each of said ends of said sequential series representing the row and column keyboard output as the relative position of said pressed key.

2. A multikey keyboard for inputting data and commands into a computer comprising:
   (a) a plurality of normally open, key activated, switch means;
   (b) a common circuit lead operatively connected to each of said plurality of switch means;
   (c) a set of n essentially parallel first conductors wherein each first conductor represents up to y rows or subset of rows of keys and wherein each first conductor is connected to at least one separate sequential series of a plurality of up to y capacitors, thus forming n separate row outputs to the computer;
   (d) a set of m essentially parallel second conductors wherein each second conductor represents up to x columns or subsets of columns of keys and wherein each second conductor is connected to at least one separate sequential series of a plurality of up to x capacitors, thus forming m separate column outputs to the computer and wherein said set of essentially parallel row and column conductors are superimposed such that said plurality of normally open, key activated, switch means are located at the intersection of the sets of row and column conductors such that when a key is pressed the corresponding normally open switch closes thus completing the circuit between said common circuit lead and n row output conductors and m column output conductors thus allowing for a n times x by m times y matrix of keys; where n, m, x, and y are integers.

3. A multikey keyboard of claim 1 or 2 wherein the individual capacitance values within said sequential series of capacitors are increased nonlinearly such as to enhance the computer's ability to discriminate which key was pressed.

4. A multikey keyboard of claim 3 further comprising a sensor conductor output circuit means which when a key of one of said switch means is pressed completes the circuit between said common circuit lead and said sensor conductor output circuit means, thus outputting a separate signal to the computer indicating that a key has been pressed and that the capacitance measurement should take place.

5. A multikey keyboard of claim 1 or 2 wherein said keyboard further comprises two opposed printed circuit sheets separated by an insulated sheet perforated at the position of the keys such that said switch means is created by having at least one of said opposed printed circuit sheets being sufficiently flexible such that said flexible sheet may be pressed at the position of said key thus completing said capacitive row and column keyboard output of said computer by physically contacting said printed circuit sheets to each other.

6. A multikey keyboard of claim 4 wherein said keyboard further comprises two opposed printed circuit sheets separated by an insulated sheet perforated at the position of the keys such that said switch means is created by having at least one of said opposed printed circuit sheets being sufficiently flexible such that said flexible sheet may be pressed at the position of said key thus completing said output circuit by physically contacting said printed circuit sheets to each other.

7. A multikey keyboard of claim 5 wherein said capacitors are deposited on said printed circuit sheets.

8. A multikey keyboard of claim 1 wherein said capacitors are deposited on said printed circuit sheets.

9. A multikey keyboard of claim 6 wherein said capacitors are deposited on said printed circuit sheets.

10. A multikey keyboard of claim 7 further comprising an information panel associated with said keys so as to effect the corresponding data inputs by pressing the chosen keys.

11. A multikey keyboard of claim 8 further comprising an information panel associated with said keys so as to effect the corresponding data inputs by pressing the chosen keys.

12. A multikey keyboard of claim 9 further comprising an information panel associated with said keys so as to effect the corresponding data inputs by pressing the chosen keys.

13. A multikey keyboard of claim 10 wherein said information is in Braille.

14. A multikey keyboard of claim 11 wherein said information is in Braille.

15. A multikey keyboard of claim 12 wherein said information is in Braille.

16. A multikey keyboard of claim 10 wherein said informational panel is an overlay with deformed key tabs.

17. A multikey keyboard of claim 11 wherein said informational panel is an overlay with deformed key tabs.

18. A multikey keyboard of claim 12 wherein said informational panel is an overlay with deformed key tabs.

* * * * *